United States Patent
Jung et al.

(10) Patent No.: US 6,642,110 B2
(45) Date of Patent: Nov. 4, 2003

(54) FLASH MEMORY CELL AND METHOD OF MANUFACTURING THE SAME

(75) Inventors: Sung Mun Jung, Ichon-Shi (KR); Sung Bo Sim, Ichon-Shi (KR); Kwi Wook Kim, Sungnam-Shi (KR)

(73) Assignee: Hyundai Electronics Industries Co., Ltd., Seoul (KR)

( * ) Notice: Subject to any disclaimer, the term of this patent is extended or adjusted under 35 U.S.C. 154(b) by 0 days.

(21) Appl. No.: 10/224,561

(22) Filed: Aug. 21, 2002

(65) Prior Publication Data

US 2003/0003663 A1 Jan. 2, 2003

Related U.S. Application Data

(62) Division of application No. 09/474,371, filed on Dec. 29, 1999, now Pat. No. 6,465,833.

(30) Foreign Application Priority Data

Dec. 30, 1998 (KR) .............................................. 98-61376

(51) Int. Cl.⁷ ......................................... H01L 21/8247
(52) U.S. Cl. ........................ 438/264; 438/267; 438/594
(58) Field of Search ................................ 438/257–267, 438/593–4

(56) References Cited

U.S. PATENT DOCUMENTS

| | | | | |
|---|---|---|---|---|
| 5,143,860 A | * | 9/1992 | Mitchell et al. | 438/262 |
| 5,281,548 A | * | 1/1994 | Prall | 438/259 |
| 5,427,968 A | * | 6/1995 | Hong | 438/264 |
| 5,563,085 A | | 10/1996 | Kohyama | 437/52 |
| 5,843,820 A | | 12/1998 | Lu | 438/243 |
| 5,973,354 A | | 10/1999 | Chang | 257/315 |
| 6,093,945 A | * | 7/2000 | Yang | 257/317 |
| 6,157,060 A | | 12/2000 | Kerber | 257/316 |
| 6,218,698 B1 | | 4/2001 | Hai | 257/317 |

FOREIGN PATENT DOCUMENTS

JP  4-111470  4/1992

* cited by examiner

*Primary Examiner*—Richard Booth
(74) *Attorney, Agent, or Firm*—Pennie & Edmonds LLP

(57) ABSTRACT

There is disclosed a flash memory cell and method of manufacturing the same, in which the circular hole is formed in the insulating film formed on the silicon substrate, the floating gate having a cylindrical shape is formed within the hole and the control gate is formed within the floating gate. Therefore, the source used as a current supply and the silicon substrate may be formed integratedly, and also the process of forming a device separation film can be omitted, thus allowing manufacturing an ultra high integration nonvolatile memory device.

19 Claims, 2 Drawing Sheets

FLASH MEMORY CELL AND METHOD OF MANUFACTURING THE SAME

RELATED APPLICATIONS

This is a Divisional of U.S. application Ser. No. 09/474,371, filed Dec. 29, 1999, now U.S. Pat. No. 6,465,833.

BACKGROUND OF THE INVENTION

The present invention relates to a flash memory cell and method of manufacturing the same. In particular, the present invention relates to a flash memory cell and method of manufacturing the same in which a circular hole is formed in an insulating film formed on a silicon substrate and a cylindrical floating gate is formed within the hole, thus improving the integration degree of the device.

Generally, the non-volatile memory device finds a variety of application. A lot of study has been made to a mass storage memory that is one of them since it is superior to the magnetic mass storage means such as a hard disk, a floppy disk etc. in view of power consumption, size and operating speed etc. However, a study on the magnetic mass storage means has been developed to a level having a Giga byte memory capacity, while the nonvolatile memory has been developed to a level a 64M, 256M byte memory capacity. Therefore, in order to develop a non-volatile memory device having more memory capacity than the magnetic mass storage means, it is a prerequisite that the size of the chip has to be reduced.

The flash memory device that is one of these non-volatile memory devices has the function of electrical program and erase, and the memory cell of the flash memory device may be classified into a stack type and a split type depending on what type of gate electrode they have.

A conventional flash memory cell having the stack-type gate electrode will be explained by reference to FIG. 1.

As shown in FIG. 1, the conventional flash memory cell has a gate electrode in which a tunnel oxide film 2, a floating gate 3, a dielectric film 4 and a control gate 5 are stacked on a silicon substrate 1 on which a field oxide film (not shown) is formed, wherein source and drain 6A and 6B into which impurities are injected are each formed on the silicon substrate 1 on both side of the gate electrodes.

In the conventional flash memory cell constructed as above, upon a program, erase or read operation, respective bias voltages are applied to the silicon substrate 1, the control gate 5, the source and 6A and 6B, respectively. The control gate 5 used as a word line and the drain 6B connected to the bit line, are constituent elements necessary to select one of the memory cells. Also, the source 6A is used as a current supply. Therefore, upon all the operations including program, erase and read, the source 6A and the silicon substrate 1 are connected to the ground. Due to these operational characteristics, in the conventional flash memory device, the source 6A occupies about 20% of the area in unit cell. Therefore, in order to reduce the size of the device, the area of the source 6A has to be reduced. However, there is limit reduce the area of the source 6A using the current technology.

SUMMARY OF THE INVENTION

It is an object of the present invention to solve the problems involved in the prior art, and to provide a flash memory cell and method of manufacturing the same in which a circular hole is formed in an insulating film formed on a silicon substrate and a cylindrical floating gate is formed within the hole, thus overcoming the above problems.

To achieve the above object, the flash memory cell according to the present invention is characterized in that it comprises a silicon substrate on which a junction area is formed; a floating gate formed in the shape of a cylinder on the junction area of the silicon substrate and electrically separated from the silicon substrate by a tunnel oxide film; and a control gate formed on the floating gate, the portion inserted into the floating gate being formed in the shape of a cylinder and electrically separated from the floating gate by a dielectric film.

To achieve the above object, the method of manufacturing a flash memory cell according to the present invention is characterized in that it comprises the steps of forming first and second insulating films on a silicon substrate and patterning the second and first insulating films sequentially to form a circular hole so that a given portion of the silicon substrate can be exposed; forming a tunnel oxide film on the silicon substrate exposed within the hole and then forming a floating gate having a spacer shape on a side wall of the hole; injecting impurities into the silicon substrate exposed within the hole to form a junction area, and then forming a dielectric film on the floating gate; and depositing polysilicon on the entire upper surface so that the hole can be buried and then patterning the resultant to form a control gate.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

One preferred embodiment of the present invention will be below explained by reference to the accompanying drawings.

Figure 3:
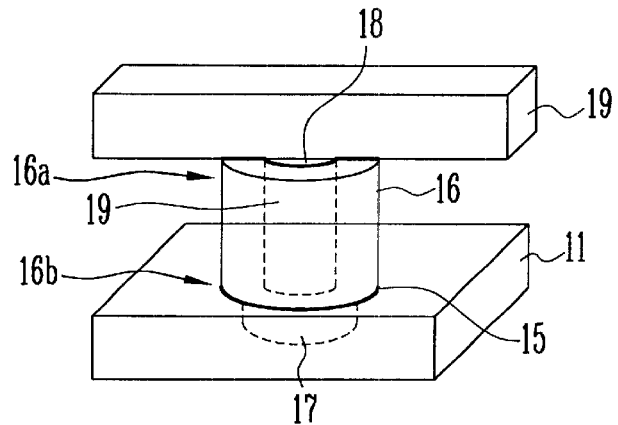
FIG. 3 is a structural view of a flash memory cell according to the present invention.
Figure 4:
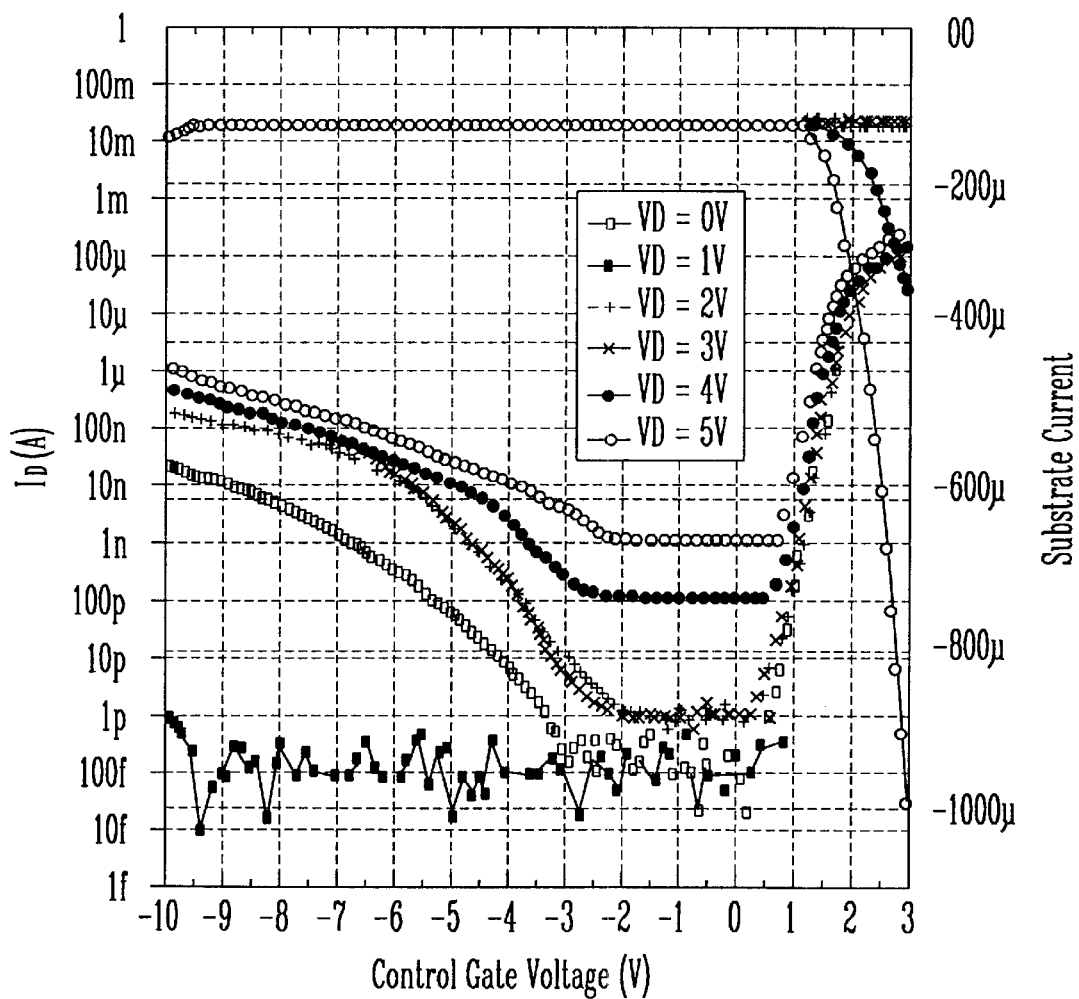
FIG. 4 is a graph for explaining the present invention.

FIGS. 2A through 2D are sectional views of the device for illustrating the method of manufacturing a flash memory cell according to the present invention, which will be explained by reference to FIGS. 3 and 4.

Figure 1:
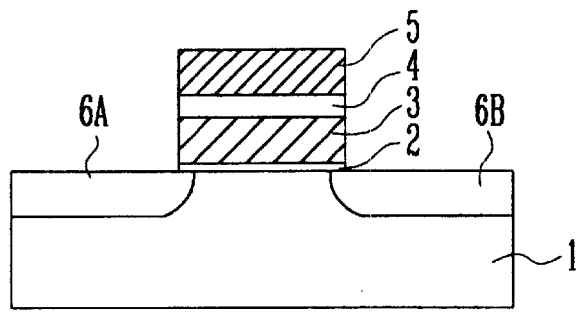
FIG. 1 is a sectional view for illustrating a conventional flash memory cell.
Figure 2A:
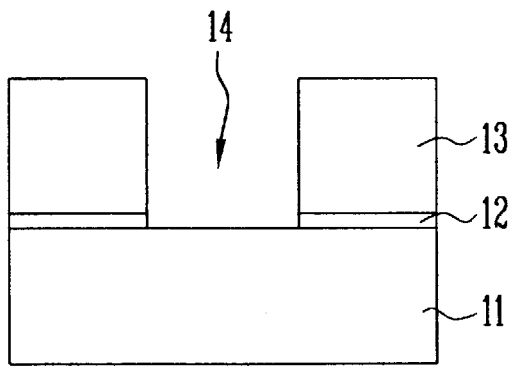
FIGS. 2A through 2D are sectional views of the device for illustrating the method of manufacturing a flash memory cell according to the present invention.

FIG. 2A is a sectional view in which first and second insulating films 12 and 13 are sequentially formed on a silicon substrate 11 and the second and first insulating films 13 and 12 are sequentially patterned to form a circular hole 14 therein so that a given portion of the silicon substrate 11 is exposed, wherein the first insulating film 12 is formed in thickness of 0 through 500 Å, and the second insulating film 13 is made of BPSG or CVD oxide film and is formed in thickness of 1000 through 5000 Å.

Figure 2B:
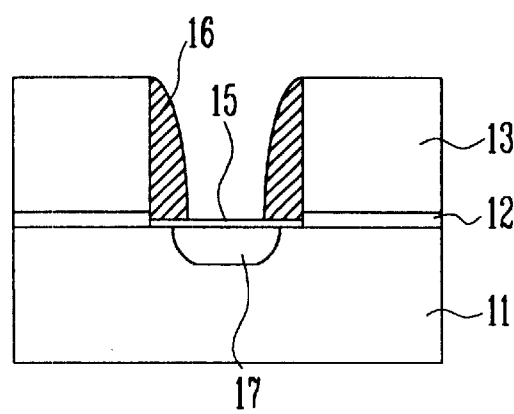

FIG. 2B is a sectional view in which a tunnel oxide film 15 is formed in thickness of 70 through 120 Å on the silicon substrate 11 exposed within the hole 14 and then a floating gate 16 of a spacer shape is formed on a side wall of the hole 14, wherein said floating gate 16, after a polysilicon layer is formed on the entire upper surface including the hole 14, is formed by spacer-etching the polysilicon layer until the second insulating film 13 is exposed, and the polysilicon layer is formed in thickness of less than ½ of the diameter of the hole 14.

Figure 2C:
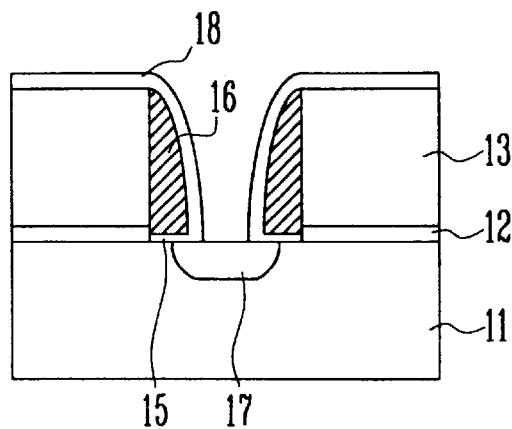

In FIG. 2C, there is shown a sectional view in which impurities are injected into the silicon substrate 11 exposed within the hole 14 to form a junction area 17 and then a dielectric film 18 is formed on the floating gate 16 in thickness of 500 through 2500 Å, wherein the dielectric film 18 has a stacked structure of a lower oxide film, a nitride oxide film and an upper oxide film.

Figure 2D:
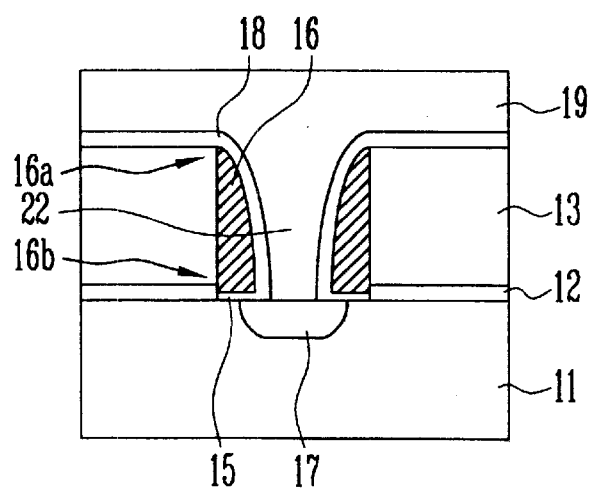

In FIG. 2D, there is shown a sectional view in which polysilicon is deposited on the entire upper surface so that the hole 14 can be buried and is patterned to form a control gate 19.

Here, for easy understanding of the present invention, the characteristic portions of the present invention will be explained by reference to FIG. 3. The flash memory cell according to the present invention includes a single junction area 17 formed on a silicon substrate 11, a floating gate 16 cylindrically formed on the silicon substrate 11, and a control gate 19 wherein a portion 22 inserted into the floating gate 16 is made of a cylindrical shape. The floating gate 16 has an annular sidewall extending between a lower annular end 16a proximate to the junction area, and an upper annular end 16b remote therefrom. The lower annular end and the upper annular end are open in the sense that the floating gate 16 has a tubular structure with both ends of the tube being open, the hollow portion of the tubular structure being substantially occupied by the control gate 19, as best seen in FIGS. 2D and 3. The floating gate 16 is electrically separated from the silicon substrate 11 by the tunnel oxide film 15 and is also electrically separated from the control gate 19 by the dielectric film 18.

The flash memory cell constructed as above has the function of program, erase and read.

Upon a program operation, a voltage of −6 through −15V is applied to the control gate 19. As the voltage is applied, electrons emitted from the junction area 17 due to the voltage difference between the junction area 17 and the floating gate 16 are injected into the floating gate 16 via the tunnel oxide film 15. Thus, a selected memory cell is programmed by this F-N tunneling effects. At this time, the voltage level of the floating gate 16 is about −3 through −8V.

Upon an erase operation, a voltage of +6 through +15V is applied to the control gate 19. As the voltage is applied, electrons injected into the floating gate 16 due to the voltage difference between the junction area 17 and the floating gate 16 are moved to the junction area 17 via the tunnel oxide film 15. Thus, the selected memory cell is erased by this F-N tunneling effects. At this time, the potential of the floating gate 16 is about −1 through +0.5V.

The read operation is performed when a bias voltage relatively higher than the voltage applied to the control gate 19 is applied to the junction area 17. At this time, a deep depletion area is formed in the junction area 17 of the portion overlapped with the floating gate 16, which causes to flow a Band to Band Current. When measuring this phenomenon by use of a general transistor, this can be shown as variations in the drain current ID depending on the Gate Sweep of the Negative, as shown in FIG. 4.

In other words, upon a read operation, the voltage applied to the junction area 17, i.e. the drain voltage VD is 3V. If the memory cell is programmed, the potential of the floating gate 16 is about −8V and at this time the drain current ID is about 100 nA. Also, if the memory cell is erased, the potential of the floating gate 16 is about 0V and at this time the drain current ID is about 1 pA. Therefore, it has been found that the state of the memory cell can be read by sensing the drain current ID.

As described above, according to the present invention, it forms the circular hole in the insulating film formed on the silicon substrate, forms the floating gate having a cylindrical shape within the hole and forms the control gate within the floating gate. With this method, the source used as a current supply and the silicon substrate may be formed integratedly, and also the process of forming a device separation film can be omitted. Thus, the present invention has the advantages that it can reduce the size of the device by 60% compared to that of the convention device, thus allowing manufacturing an ultra high integration non-volatile memory device.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a flash memory cell, comprising the steps of:
    forming first and second insulating films on a silicon substrate and patterning the second and first insulating films sequentially to form a circular hole so that a given portion of the silicon substrate can be exposed;
    forming a tunnel oxide film on the silicon substrate exposed within the hole and then forming a floating gate having a spacer shape on a side wall of the hole;
    after forming the floating gate, injecting impurities into the silicon substrate exposed within the hole to form a junction area, and then forming a dielectric film on the floating gate; and
    depositing polysilicon on the entire upper surface so that the hole can be buried and then patterning the resultant to form a control gate.

2. The method of manufacturing a flash memory cell as claimed in claim 1, wherein said first insulating film is formed in thickness of 500 Å and below and said second insulating film is formed in thickness of 1000 through 5000 Å.

3. The method of manufacturing a flash memory cell as claimed in claim 1, wherein said second insulating film is made of one of a BPSG film and a CVD oxide film.

4. The method of manufacturing a flash memory cell as claimed in claim 1, wherein said tunnel oxide film is formed in thickness of 70 through 120 Å.

5. The method of manufacturing a flash memory cell as claimed in claim 1, wherein said dielectric film has a structure in which a lower oxide film a nitride film and an upper oxide film are stacked and is formed in thickness of 500 through 2500 Å.

6. The method of manufacturing a flash memory cell as claimed in claim 1, wherein said floating gate and said control gate are made of polysilicon.

7. A method of manufacturing a flash memory cell, comprising the steps of:
    forming first and second insulating films on a silicon substrate and patterning the second and first insulating films to form a hole so as to expose a portion of the silicon substrate;
    forming a tunnel oxide film on the silicon substrate exposed within the hole and then forming a floating gate on a tide wall of the hole, the floating gate having an annular sidewall provided with an open lower annular end, and an open upper annular end;

after forming the floating gate, injecting impurities into the silicon substrate exposed within the hole to form a junction area, and then forming a dielectric film on the floating gate; and depositing polysilicon on the entire upper surface so that the hole can be buried and then patterning the resultant to form a control gate.

8. The method of manufacturing a flash memory cell as claimed in claim 7, wherein said first insulating film is formed in thickness of 500 Å and below and said second insulating film is formed in thickness of 1000 through 5000 Å.

9. The method of manufacturing a flash memory cell as claimed in claim 7, wherein said second insulating film is made of one of a BPSG film and a CVD oxide film.

10. The method of manufacturing a flash memory cell as claimed in claim 7, wherein said second insulating is formed in thickness of 70 through 120 Å.

11. The method of manufacturing a flash memory cell as claimed in claim 7, wherein said dielectric film has a structure in which a lower oxide film a nitride film and an upper oxide film are stacked and is formed in thickness of 500 through 2500 Å.

12. The method of manufacturing a flash memory cell as claimed in claim 7, wherein said floating gate and said control gate are made of polysilicon.

13. A method of manufacturing a flash memory cell, comprising the steps of:

forming first and second insulating films on a silicon substrate and patterning the second and first insulating films to form a hole so as to expose a first portion of the silicon substrate;

forming a tunnel oxide film on the silicon substrate exposed within the hole and then forming a floating gate on a side wall of the hole while still leaving part of said first portion of the silicon substrate exposed;

injecting impurities into the silicon substrate exposed within the hole to form a junction area, and then forming a dielectric film on the floating gate; and depositing polysilicon on the entire upper surface so that the hole can be buried and then patterning the resultant to form a control gate.

14. The method of manufacturing a flash memory cell as claimed in claim 13, wherein the floating gate has an annular sidewall provided with an open lower annular end, and an open upper annular end defining therebetween a passage through which said impurities are injected.

15. The method of manufacturing a flash memory cell as claimed in claim 14, wherein said first insulating film is formed in thickness of 500 Å and below and said second insulating film is formed in thickness of 1000 through 5000 Å.

16. The method of manufacturing a flash memory cell as claimed in claim 14, wherein said second insulating film is made of one of a BPSG film and a CVD oxide film.

17. The method of manufacturing a flash memory cell as claimed in claim 14, wherein said tunnel oxide film is formed in thickness of 70 through 120 Å.

18. The method of manufacturing a flash memory cell as claimed in claim 14, wherein said dielectric film has a structure in which a lower oxide film a nitride film and an upper oxide film are stacked and is formed in thickness of 500 through 2500 Å.

19. The method of manufacturing a flash memory cell as claimed in claim 14, wherein said floating gale and said control gate are made of polysilicon.

* * * * *